(12) United States Patent
Li

(10) Patent No.: US 9,001,240 B2
(45) Date of Patent: Apr. 7, 2015

(54) COMMON ELEMENT PIXEL ARCHITECTURE (CEPA) FOR FAST SPEED READOUT

(75) Inventor: Xiangli Li, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 513 days.

(21) Appl. No.: 13/093,077

(22) Filed: Apr. 25, 2011

(65) Prior Publication Data

US 2012/0188424 A1    Jul. 26, 2012

Related U.S. Application Data

(60) Provisional application No. 61/434,739, filed on Jan. 20, 2011.

(51) Int. Cl.
*H01L 27/146* (2006.01)
*H04N 5/374* (2011.01)

(52) U.S. Cl.
CPC ........ *H04N 5/3741* (2013.01); *H01L 27/14609* (2013.01); *H01L 27/14621* (2013.01); *H01L 27/14641* (2013.01)

(58) Field of Classification Search
CPC ........................ H04N 5/3741; H01L 27/14641
See application file for complete search history.

(56) References Cited

U.S. PATENT DOCUMENTS

| | | | | |
|---|---|---|---|---|
| 3,971,065 | A * | 7/1976 | Bayer | 348/276 |
| 8,045,028 | B1 * | 10/2011 | De Wit | 348/302 |
| 2007/0252182 | A1 * | 11/2007 | Beck | 257/292 |
| 2008/0170147 | A1 * | 7/2008 | Barbier et al. | 348/308 |
| 2008/0284882 | A1 * | 11/2008 | Mori et al. | 348/294 |
| 2008/0291310 | A1 * | 11/2008 | Ladd et al. | 348/308 |
| 2009/0002538 | A1 * | 1/2009 | Mori et al. | 348/311 |
| 2010/0002117 | A1 * | 1/2010 | Iwane et al. | 348/308 |
| 2010/0097508 | A1 * | 4/2010 | Yanagita et al. | 348/301 |
| 2010/0200729 | A1 * | 8/2010 | Lee | 250/208.1 |
| 2010/0295978 | A1 * | 11/2010 | Nakamura et al. | 348/273 |
| 2011/0221941 | A1 * | 9/2011 | Sato | 348/294 |

FOREIGN PATENT DOCUMENTS

JP         2008147771 A  *  6/2008

OTHER PUBLICATIONS

JP-2008-147771-A Translation—Machine Translation of JP-2008-147771-A.*
JP-2008147771-A Translation—Machine Translation of JP-2008147771-A Jun. 2006.*

* cited by examiner

*Primary Examiner* — Jason Flohre

(57) ABSTRACT

The present invention relates to a common element pixel architecture (CEPA) imager. The CEPA includes a first column of pixels and a second column of pixels. The CEPA also includes a first column line and a second column line. A first group of pixels is arranged including pixels from the first column and the second column coupled to the first column line. A second group of pixels is arranged including other pixels from the first column and the second column coupled to the second column line.

11 Claims, 11 Drawing Sheets

US 9,001,240 B2

COMMON ELEMENT PIXEL ARCHITECTURE (CEPA) FOR FAST SPEED READOUT

CROSS REFERENCE TO RELATED APPLICATIONS

This application claims priority of U.S. Provisional Patent Application Ser. No. 61/434,739, filed Jan. 20, 2011.

FIELD OF THE INVENTION

The present invention relates, in general, to an imager device including an array of pixels for performing fast speed readout of the pixels. The pixels in the imager are configured in pixel groups having common readout circuitry. More specifically, the pixel groups are configured to alternately output pixel values over a plurality of column lines to increase readout speed.

BACKGROUND OF THE INVENTION

In conventional common element pixel architecture (CEPA) systems, pixels are configured to utilize common elements such as readout circuitry. These CEPA architectures reduce the amount of hardware necessary for implementing an imager.

Conventional CEPA systems, however, also share a single column line. For example, if adjacent pixel columns are configured to share readout circuitry, they are also configured to share the same column line (i.e. the pixels in each row/group of a respective column are readout sequentially over the same column line). This conventional CEPA system therefore inhibits readout speed of the pixels in the imager.

DETAILED DESCRIPTION

As will be described, the present invention provides a common element pixel architecture (CEPA) imager. The CEPA imager includes an array of pixels configured in pixel groups to share readout circuitry between rows and/or columns. A plurality (i.e. at least two) column lines are shared by a single column of pixels which allows multiple rows/groups of pixels in the single column to be readout simultaneously. In general, the CEPA may be implemented in different types of imagers (e.g. CMOS imagers, etc.) and for different types of pixel architectures (3T, 4T, 5T, 6T, etc.).

Figure 1A:
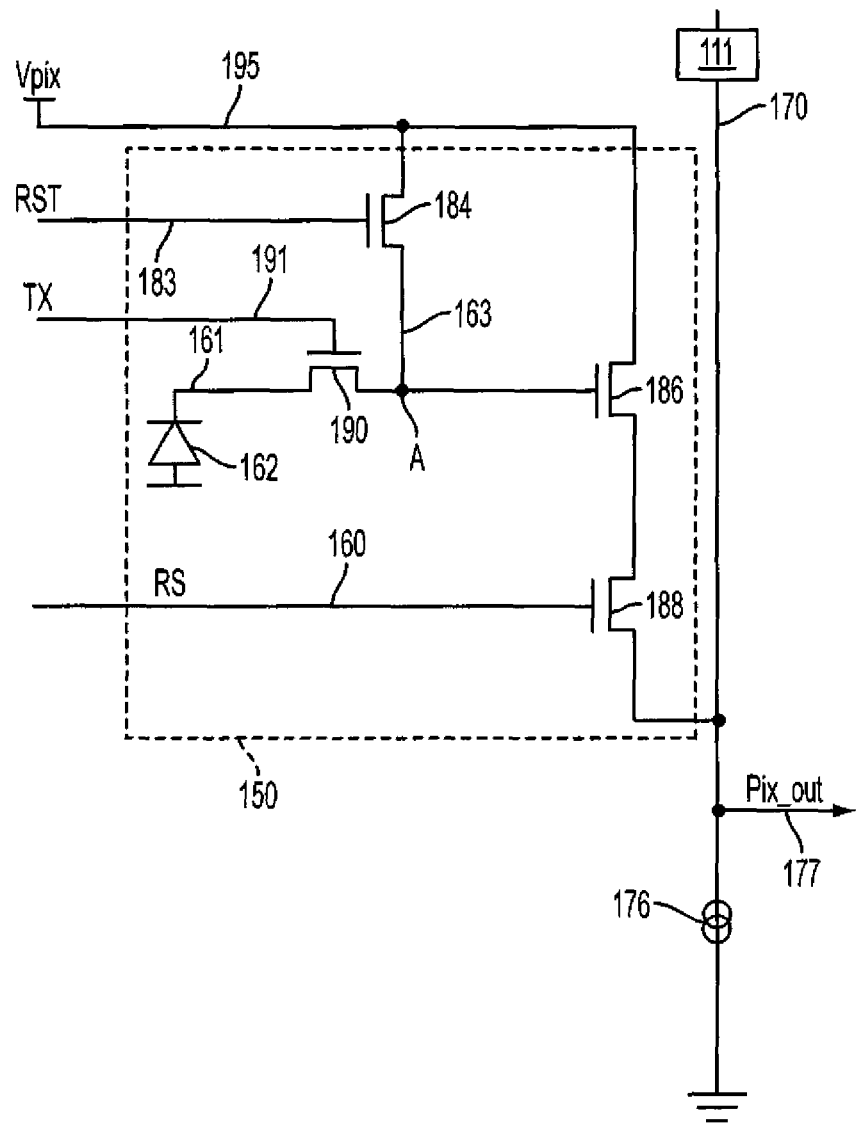
FIG. 1a is a view of a 4 transistor (4T) pixel architecture, according to an embodiment of the present invention.

A conventional four transistor (4T) circuit for a pixel 150 of a CMOS imager is illustrated in FIG. 1a. Pixel 150 is a 4T pixel, where 4T is commonly used in the art to designate use of four transistors to operate the pixel. The 4T pixel 150 has a photosensor such as a photodiode 162, a reset transistor 184, a transfer transistor 190, a source follower transistor 186, and a row select transistor 188. It should be understood that FIG. 1a shows the circuitry for operation of a single pixel 150, and that in practical use, there may be an M×N array of pixels arranged in rows and columns with the pixels of the array accessed using row and column select circuitry, as described in more detail below.

Photodiode 162 converts incident photons to electrons which are selectively passed to a floating diffusion stage node A through transfer transistor 190 when activated by the TX control signal. The source follower transistor 186 has its gate terminal connected to node A and thus amplifies the signal appearing at floating diffusion node A. When a particular row containing pixel 150 is selected by an activated row select transistor 188, the signal amplified by the source follower transistor 186 is passed on a column line 170 to a column readout circuitry 242. The photodiode 162 accumulates a photo-generated charge in a doped region of the substrate. It should be understood that the pixel 150 may include a photogate or other photon to charge converting device, in lieu of a photodiode, as the initial accumulator for photo-generated charge.

The gate terminal of transfer transistor 190 is coupled to a transfer control signal line 191 for receiving the TX control signal, thereby serving to control the coupling of the photodiode 162 to node A. A voltage source Vpix is coupled through reset transistor 184 and conductive line 163 to node A. The gate terminal of reset transistor 184 is coupled to a reset control line 183 for receiving the RST control signal to control the reset operation in which the voltage source Vpix is connected to node A.

A row select signal (RS) on a row select control line 160 is used to activate the row select transistor 180. Although not shown, the row select control line 160 used to provide a row select signal (RS) to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on column line 170 high. Maintaining a positive voltage on the column line 170 during an image acquisition phase of a pixel 150 keeps the potential in a known state on the column line 170. Signals from the pixel 150 are therefore selectively coupled to a column readout circuit through the column line 170 and through a pixel output ("Pix_out") line 177 coupled between the column line 170 and the column readout circuit.

Figure 1B:
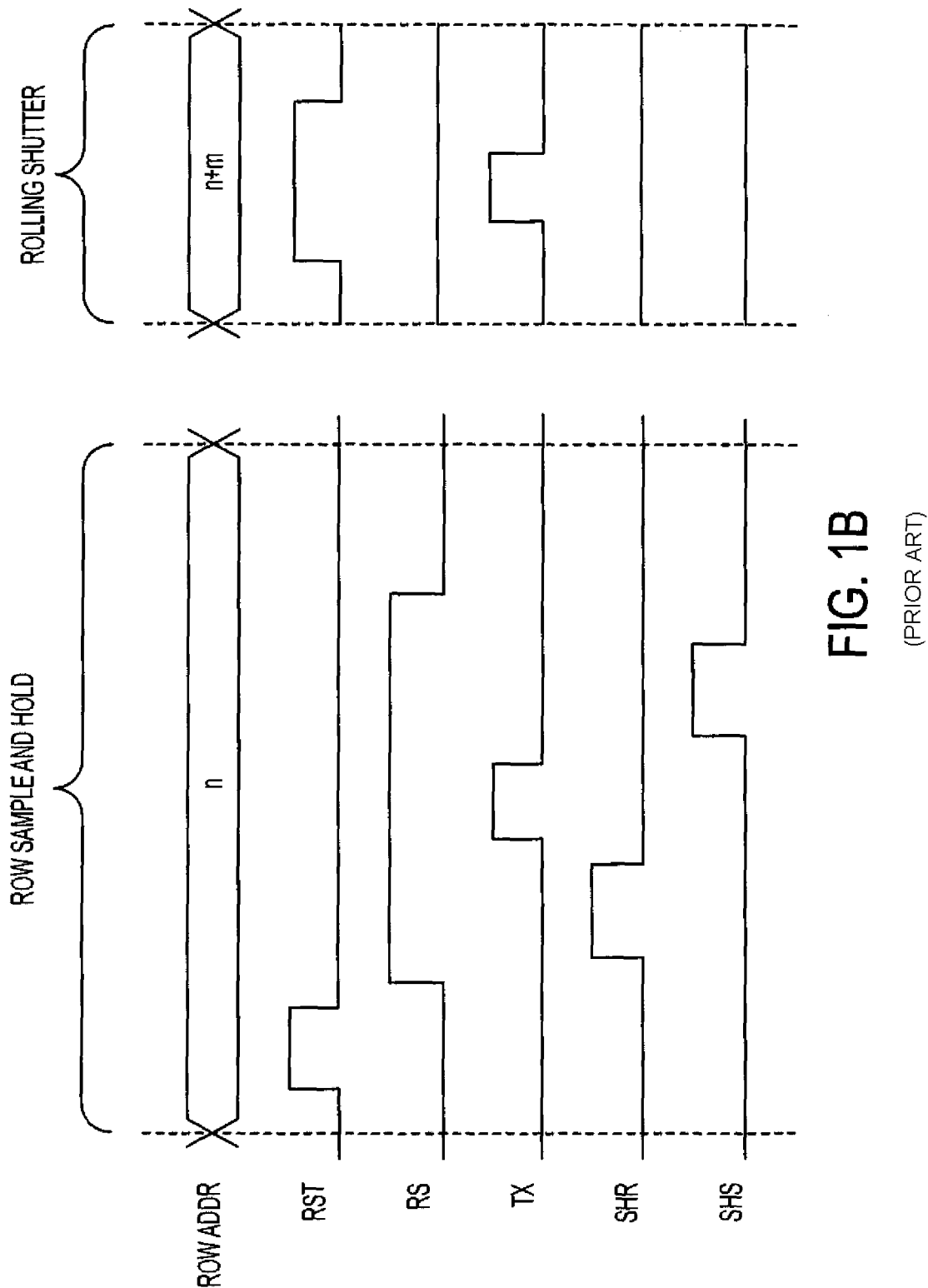
FIG. 1b is a timing diagram for the readout sequence of the 4T pixel architecture, according to an embodiment of the present invention.

As known in the art (See FIG. 1*b*), a value can be read from pixel 150 in a two step correlated double sampling process. First, node A and node 161 are reset by activating reset transistor 184 and transfer transistor 190. The remaining charge (reset signal) found at node A after reset is readout to column line 170 via the source follower transistor 186 and the activated row select transistor 188. Readout circuitry 242 in FIG. 2 then samples and holds the reset signal (SHR). During a charge integration period, photodiode 162 produces a charge from incident light. This is also known as the image acquisition period. After the integration period, transfer transistor 190 is activated and the charge from the photodiode 162 is passed through the transfer transistor to node A, where the charge is amplified by source follower transistor 186 and passed to column line 170 through the row select transistor 188. Readout circuitry 242 then samples and holds the integrated charge signal (SHS). As a result, two different voltage signals (i.e. the SHR and SHS) are readout, sampled and held for further processing as known in the art. Typically, all pixels in a row are readout simultaneously onto respective column lines 170.

Figure 2:
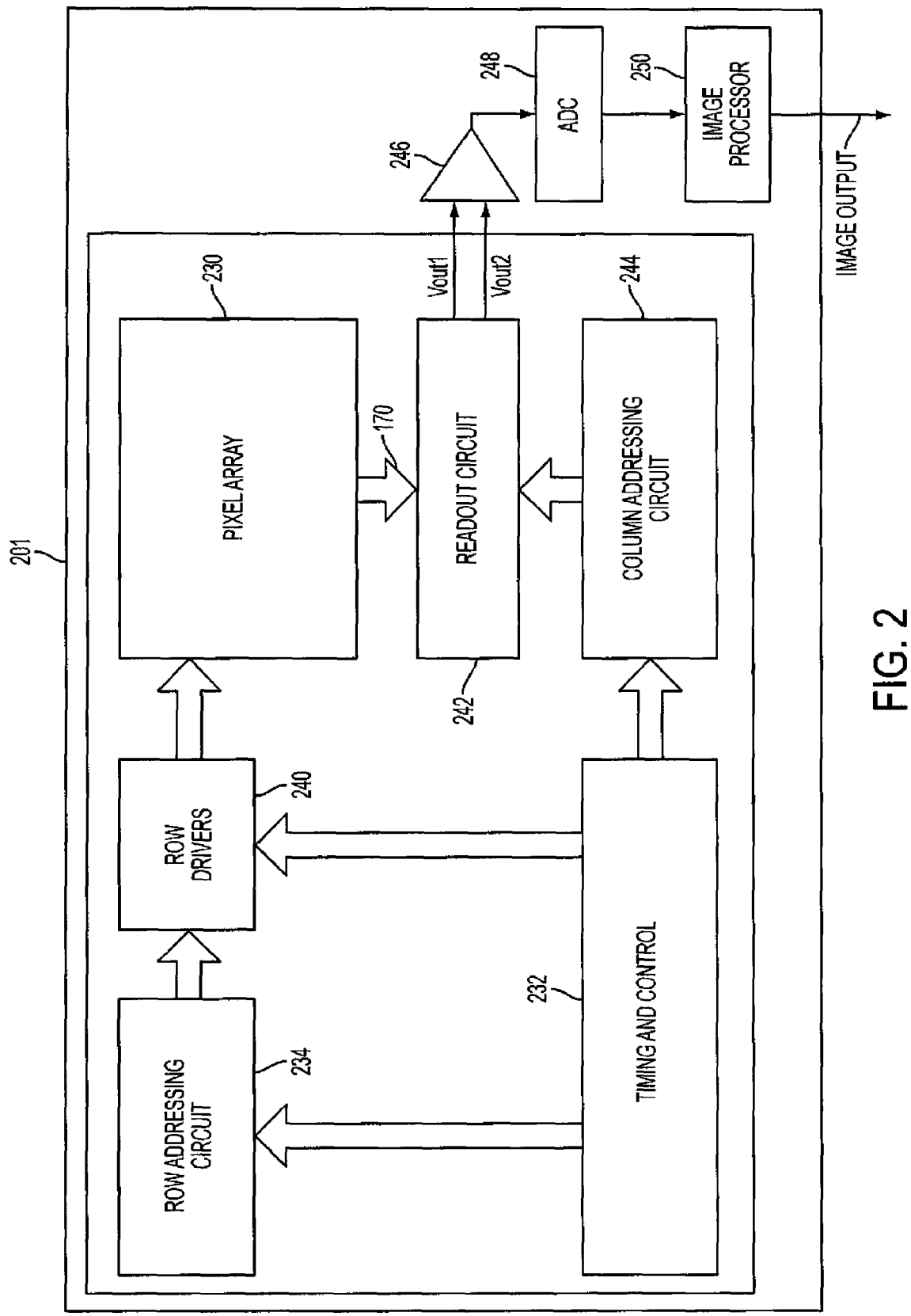
FIG. 2 is a view of a complimentary metal oxide semiconductor (CMOS) imager architecture, according to an embodiment of the present invention.

FIG. 2 shows an example CMOS imager integrated circuit chip 201 that includes an array 230 of pixels and a controller 232, which provides timing and control signals to enable reading out of signals stored in the pixels in a manner commonly known to those skilled in the art. Exemplary arrays have dimensions of M×N pixels, with the size of the array 230 depending on a particular application. The pixel signals from the array 230 are readout a row at a time using a column parallel readout architecture. The controller 232 selects a particular row of pixels in the array 230 by controlling the operation of row addressing circuit 234, row drivers 240 and column addressing circuit 244. Signals corresponding to charges stored in the selected row of pixels and reset signals are provided on the column lines 170 to a column readout circuit 242 in the manner described above. The pixel signal read from each of the columns can be readout sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in a differential amplifier 246, digitized by analog to digital converter 248, and sent to an image processor circuit 250 for image processing.

Figure 3:
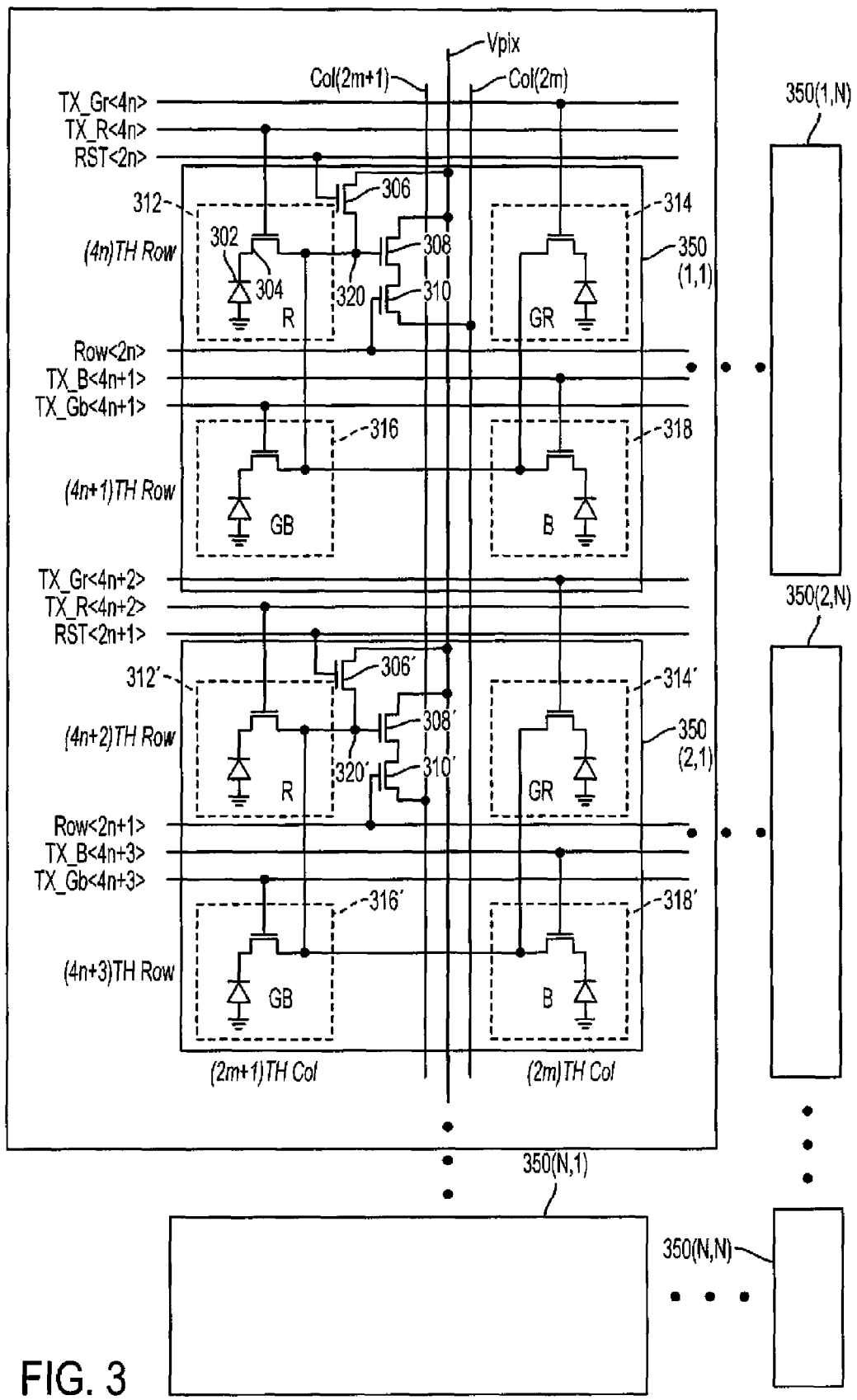
FIG. 3 is a view of a 4T CEPA with reset transistors controlled by reset lines, according to an embodiment of the present invention.

Shown in FIG. 3 is a detailed view of pixel array 230 where the pixels are arranged in a plurality of 2×2 pixel groups. It should be noted that although 2×2 dimensions are shown in FIGS. 3-10, the other arrangements are possible (e.g. 3×3, 4×4, 5×5, etc.).

In the embodiment shown in FIG. 3, pixel array 230 may include N×N groups of pixels. Details in groups 350(1,1) and 350(2,1) are shown for illustrative purposes. Specifically, group 350(1,1) includes 4 pixels (312, 314, 316 and 318). Each of the pixels is covered by a color filter array (CFA), such as Bayer pattern which includes a color pattern of a red filter, two green filters and a blue filter (R, GR, GB and B). The respective filters allow specific light to pass through to the respective pixels (i.e. pixel 312 accumulates charge in response to red line, pixels 314 and 316 accumulate charge in response to green light, and pixel 318 accumulates charge and response to blue light). In general, this color pattern is repeated for the groups across pixel array 230. It is noted that other color filter arrays may be utilized.

In general, each pixel in array 230 includes a photodiode 302 and a transfer transistor 304. By configuring each pixel with its own transfer transistor, independent readout of each pixel value is provided in response to different control signals. Each group also includes common elements such as reset transistor 306, source follower transistor 308 and row select transistor 310.

In the embodiment shown in FIG. 3, the system alternately connects each group to one of two different column lines (e.g. Col(2*m*+1) and Col(2*m*)). For example, group 350(1,1) is connected to Col(2*m*) whereas group 352(1) is connected to col(2*m*+1). This arrangement is alternated in a column wise configuration where every other column wise group is connected to a different column line (e.g. group 350(3,1) is connected to column line Col(2*m*) whereas group 350(4,1) is connected to column line Col(2*m*+1).

Although in FIG. 3 every other group is alternately connected to the two different column lines, it is also noted that there may be other configurations (i.e. every two, three, four, etc. pixel groups may be connected to the same column and then alternated). It is noted that this general configuration is repeated for all the groups in pixel array 230 (e.g. groups 350(1,2) and 350(2,2) are arranged in a similar manner to groups 350(1,1) and 350(2,1)).

In general, each group includes a shared pixel readout circuit that includes reset transistor 306, source follow transistor 308 and row select transistor 310 which operate similarly to the standard 4T configuration described above with respect to FIGS. 1*a* and 1*b*. An advantage of the system shown in FIG. 3, however, is the inclusion of an extra column line.

The configuration shown in FIG. 3 (i.e. groups alternating outputs among more than one column line) allows pixels in adjacent pixel groups (i.e. pixels in the same column) to be readout simultaneously. For example, red pixel 312 may have its value output on column line Col(2*m*) while red pixel 312' of another group in the same column may have its value output on column line Col(2*m*+1). Since these two pixel groups are outputting pixel values on separate column lines, they may be readout simultaneously without interference. In general, having two or more column lines alternately connected to the pixel groups allows the pixel array 230 to be readout faster than a system that only has a single column line.

It is noted that the pixel array 230 may be arranged with more than two column lines (i.e. three, four, etc.). For example, if three column lines are included, then pixel group 350(1,1) may be connected to col(2*m*), pixel group 350(2,1) may be connected to column line Col(2*m*+1) and pixel group 350(3,1) may be connected to column line Col(2*m*+2) (not shown). This configuration would repeat for each group all the way to pixel group 350(N,1). Thus, three pixel groups in each column may be read simultaneously therefore allowing the pixel array 230 to be readout three times as fast as a standard pixel array with a single column line.

In a backside illumination (BSI) configuration for an imager, the signal line routing (i.e. the additional column lines) are not routed in the light path and therefore do not hinder the light capturing capability of the pixels in array 230. In general, the operation of the pixel groups in FIG. 3 are described below.

Photodiodes of pixels 312, 314, 316, 318, 312', 314', 316' and 318' are accumulating charge based on impinging photons of their respective colors (RGB). In one example, each pixel of a similar color is readout simultaneously between the adjacent column wise pixel groups. For example, transfer transistors 304 for both pixels 312 and 312' may be controlled by transfer line TX_R<4*n*> and TX_R<4*n*+2> to transfer accumulated charge from respective photodiodes 302 to floating diffusions 320 and 320'. Both row select transistors 310 and 310' may then be simultaneously controlled by row control line Row<2n> and Row<2n+1> to output a voltage potential onto the column lines that is proportional to the charge accumulated on floating diffusion 320. Thus, two different voltage potentials for pixels 312 and 312' are simultaneously output over different column lines Col(2m) and Col (2m+1). In general, this operation is repeated for the other three pixels in the group.

For example, pixel 314 and 314' may be readout simultaneously based on transfer lines TX_Gr<4n> and TX_Gr<4n+2>. Pixels 316 and 316' may also be readout simultaneously based on transfer lines TX_Gb<4n+1> and TX_Gb<4n+3>. Blue pixels 318 and 318' may also be readout simultaneously based on transfer lines TX_B<4n+1> and TX_B<4n+3>. This procedure described above is performed for all of the pixels in the imager.

Assuming in an example, that a small imager has group dimensions of 4×2, and four column lines (i.e. two per group), the operations for pixel readout may be as follows. In a first time period, the R pixels in groups 350(1,1), 350(2,1), 350(1,2) and 350(2,2) may be output simultaneously. In a second time period, the GR pixels in groups 350(1,1), 350(2,1), 350(1,2) and 350(2,2) may be output simultaneously. In a third time period, the GB pixels in groups 350(1,1), 350(2,1), 350(1,2) and 350(2,2) may be output simultaneously. In a fourth time period, the B pixels in groups 350(1,1), 350(2,1), 350(1,2) and 350(2,2) may be output simultaneously.

This process is then repeated for the remaining groups in the imager. In a fifth time period, the R pixels in groups 350(3,1), 350(4,1), 350(3,2) and 350(4,2) may be output simultaneously. In a sixth time period, the GR pixels in groups 350(3,1), 350(4,1), 350(3,2) and 350(4,2) may be output simultaneously. In a seventh time period, the GB pixels in groups 350(3,1), 350(4,1), 350(3,2) and 350(4,2) may be output simultaneously. In a eighth time period, the B pixels in groups 350(3,1), 350(4,1), 350(3,2) and 350(4,2) may be output simultaneously.

Figure 4:
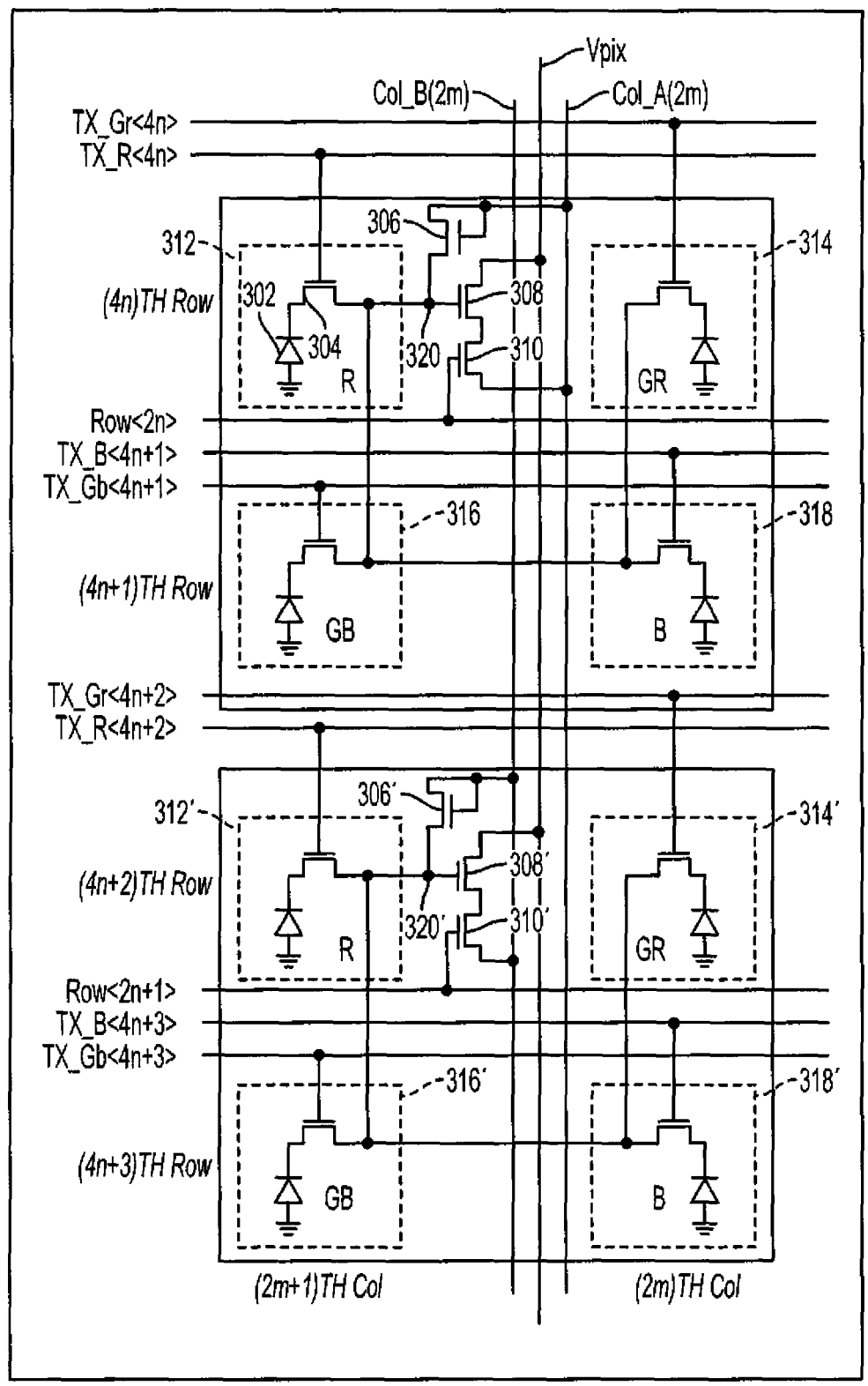
FIG. 4 is a view of another 4T CEPA with reset transistors controlled by column lines, according to an embodiment of the present invention.

Shown in FIG. 4 is another embodiment for pixel array 230 where reset lines RST(2n) and RST(2n+1) are not included. Thus, reset transistors 306 and 306' have both their gate terminals and drain terminals connected to alternating column lines (i.e. column_A(2m) and column_B(2m). Thus, floating diffusions 320 and 320' may be reset when the column line is pulled to a high potential. Column lines may then be released for the sample hold reset level (SHR) operation, charge transfer from the photodiodes, and the sample hold signal level (SHS) operation. This embodiment eliminates the need for independent reset lines to control the reset transistors.

Figure 5:
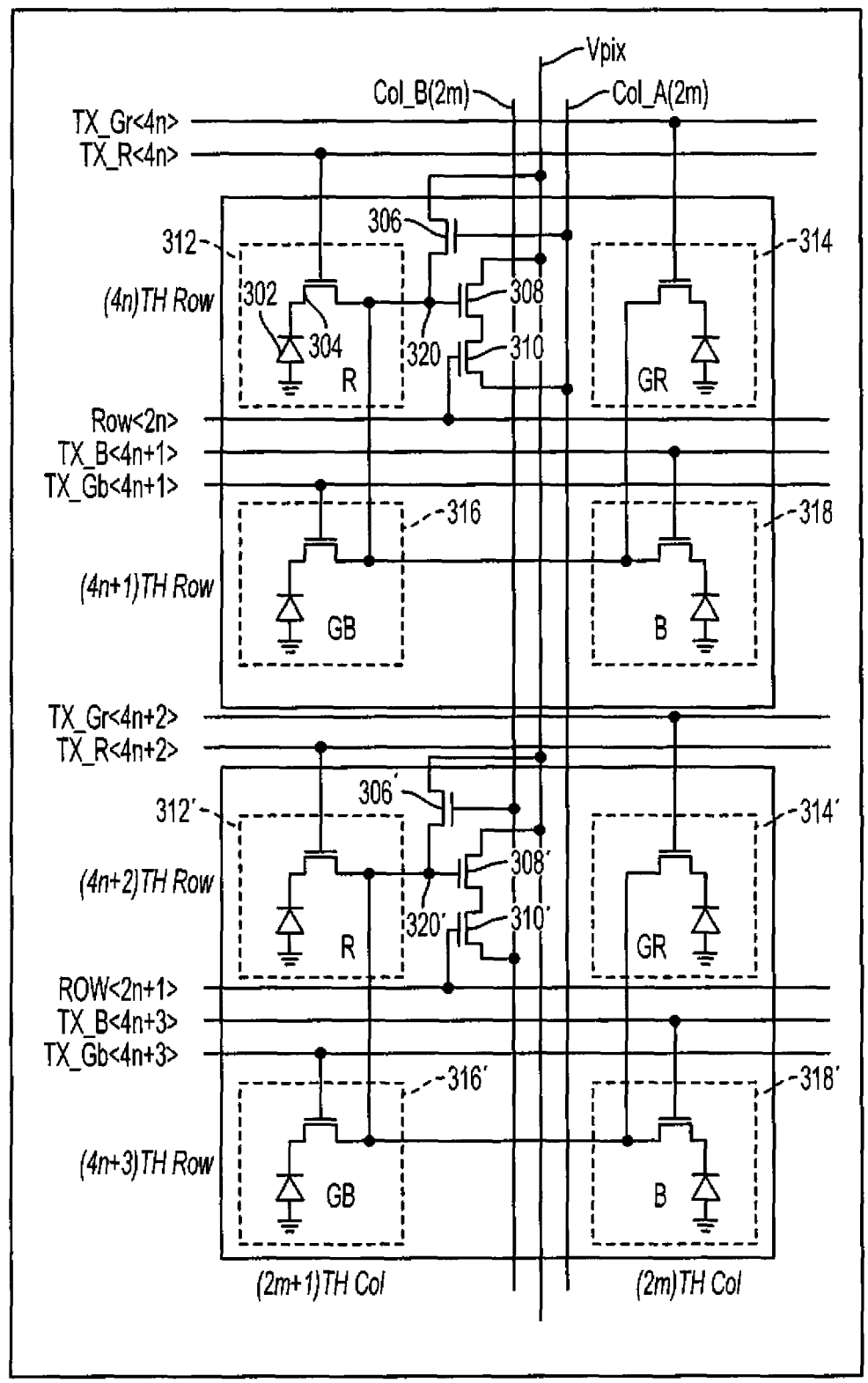
FIG. 5 is a view of another 4T CEPA with reset transistors controlled by column lines, according to an embodiment of the present invention.

In an another embodiment shown in FIG. 5, reset transistors 306 and 306' may have their drain terminals connected to voltage potential Vpix and their respective gate terminals connected to different column lines. Similar to FIG. 4, the transfer transistors are driven by different column lines which eliminates the need for the reset lines. In this embodiment, however, the floating diffusions may be connected to a specific voltage potential Vpix which is utilized to reset floating diffusions 320 and 320'. However, to reset floating diffusions 320 and 320' to voltage Vpix, the column lines are pulled high and then released for the SHR operation, charge transfer and SHS operation similar to FIG. 4.

Figure 6:
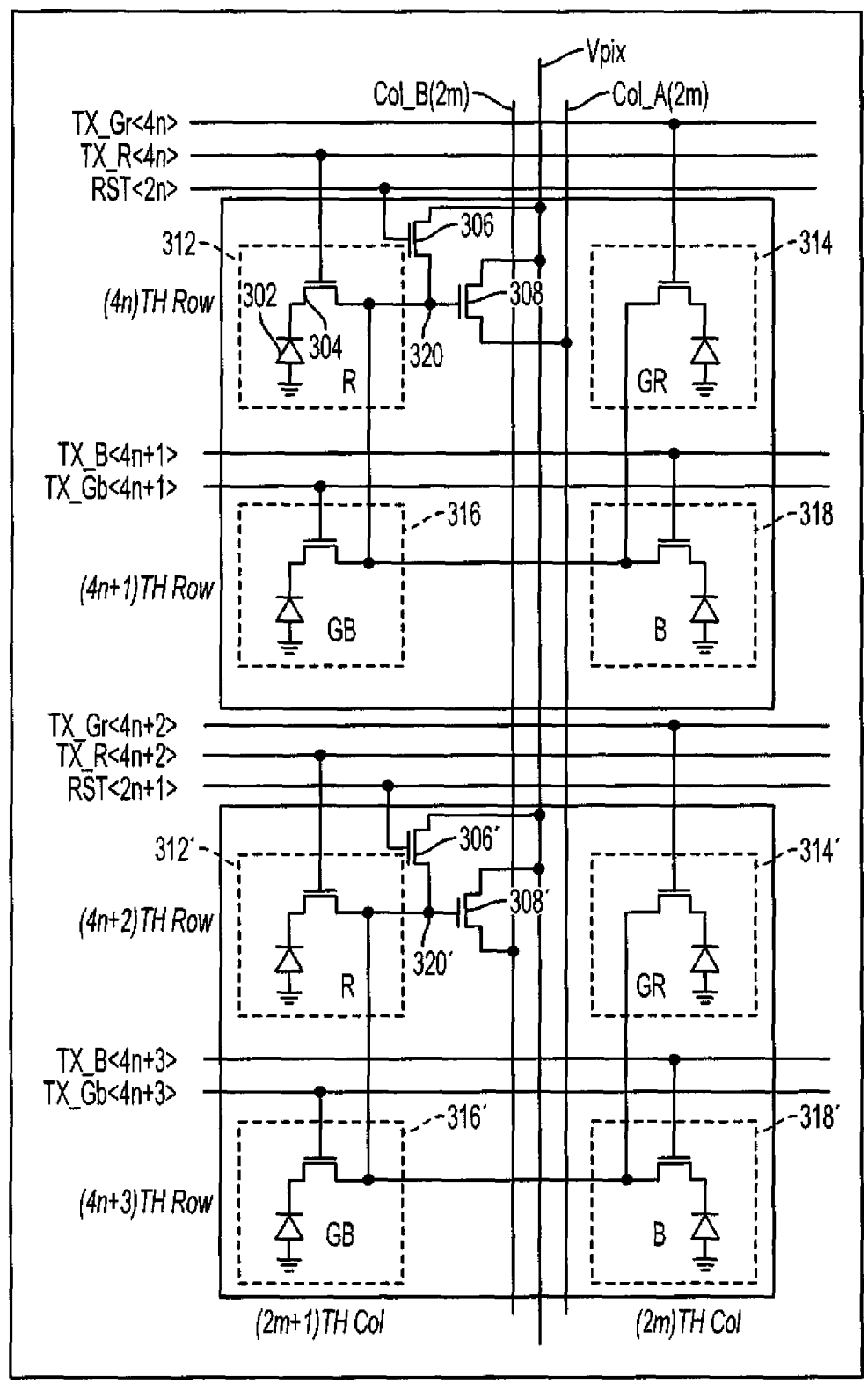
FIG. 6 is a view of another 4T CEPA without a row select transistor, and with reset transistors controlled by reset lines according to an embodiment of the present invention.

The embodiments shown in FIGS. 3, 4 and 5 include the standard 4T architecture with various configurations of reset transistors 306 and 306'. However, as shown in FIG. 6, an embodiment of the system may not utilize row select transistors 310 and 310'. In the embodiment shown in FIG. 6, source follower transistors 308 and 308' have their source terminals directly connected to the column lines. This embodiment eliminates the need for the row select lines.

To control the output of the charge onto the column lines, the level of Vpix may be controlled by another circuit (e.g. a processor not shown). For example, during operation, Vpix is held at a high potential for resetting the floating diffusions 320 and 320', performing SHR, performing a charge transfer and performing SHS. After those procedures are finished, the source follow transistors 308 and 308' may be turned off by switching voltage potential Vpix to a low potential while keeping reset transistors 306 and 306' at a high potential. In this configuration, source follow transistors 308 and 308' may be controlled to turn ON/OFF based on potential Vpix and the potentials of floating diffusions 320 and 320', therefore controlling the output onto the column lines.

Figure 7:
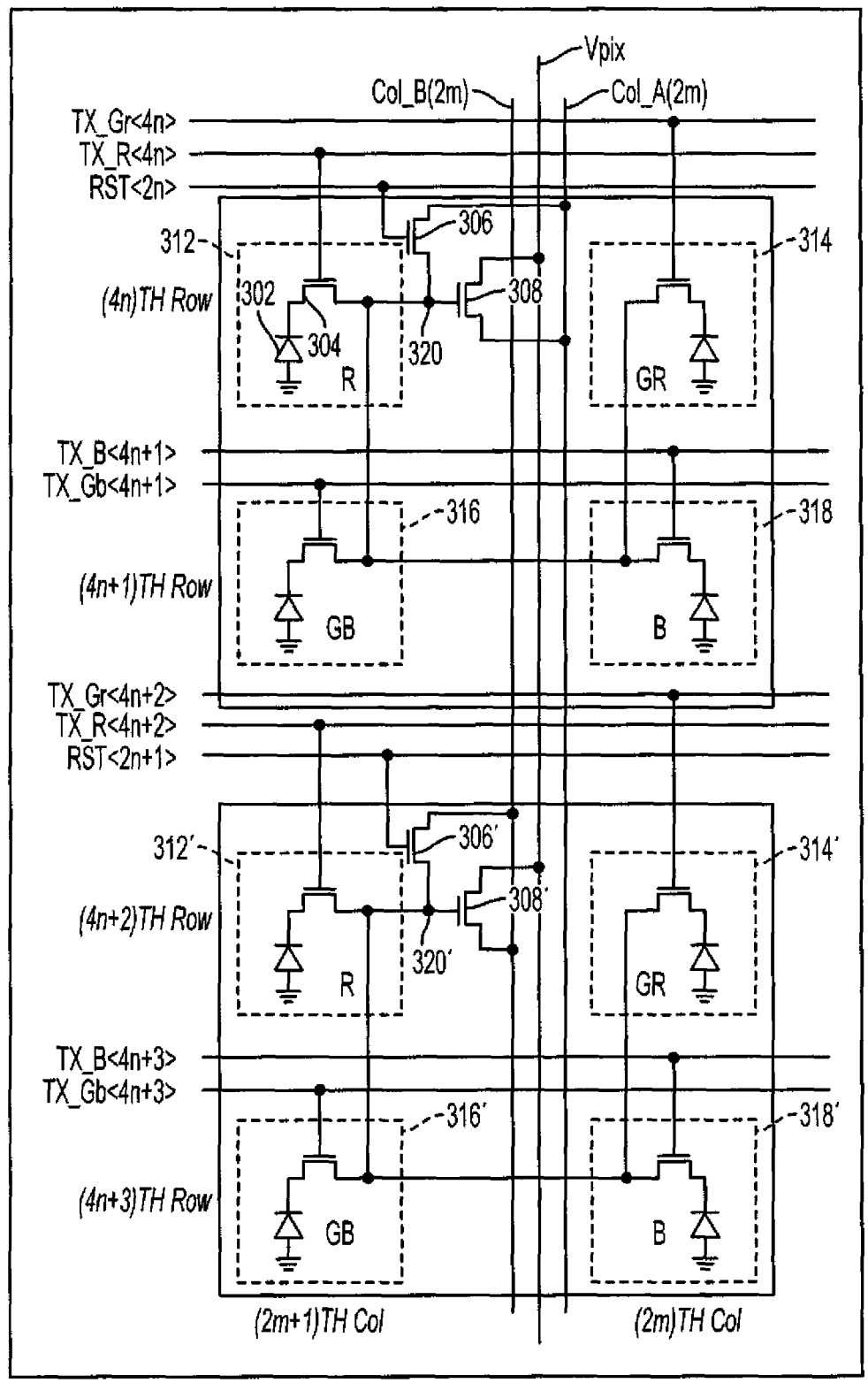
FIG. 7 is a view of another 4T CEPA without a row select transistor, and with reset transistors controlled by reset lines, according to an embodiment of the present invention.

FIG. 7 shows another embodiment where row select transistors are not included. In this embodiment, however, the reset transistors 306 and 306' have their gate terminals connected to the reset lines and their drain terminals connected to separate column lines. In this configuration, the column lines and reset lines are held at a high potential for resetting floating diffusions 320 and 320'. The column lines may then be released so that SHR, charge transfer and SHS may take place. The source follow transistors 308 and 308' may be turned off by pulling the column line down to a low potential and keeping the reset lines at a high potential. This allows the system to control the output of the charge onto the column lines based on the potential on the column lines and the potential on the reset lines.

Figure 8:
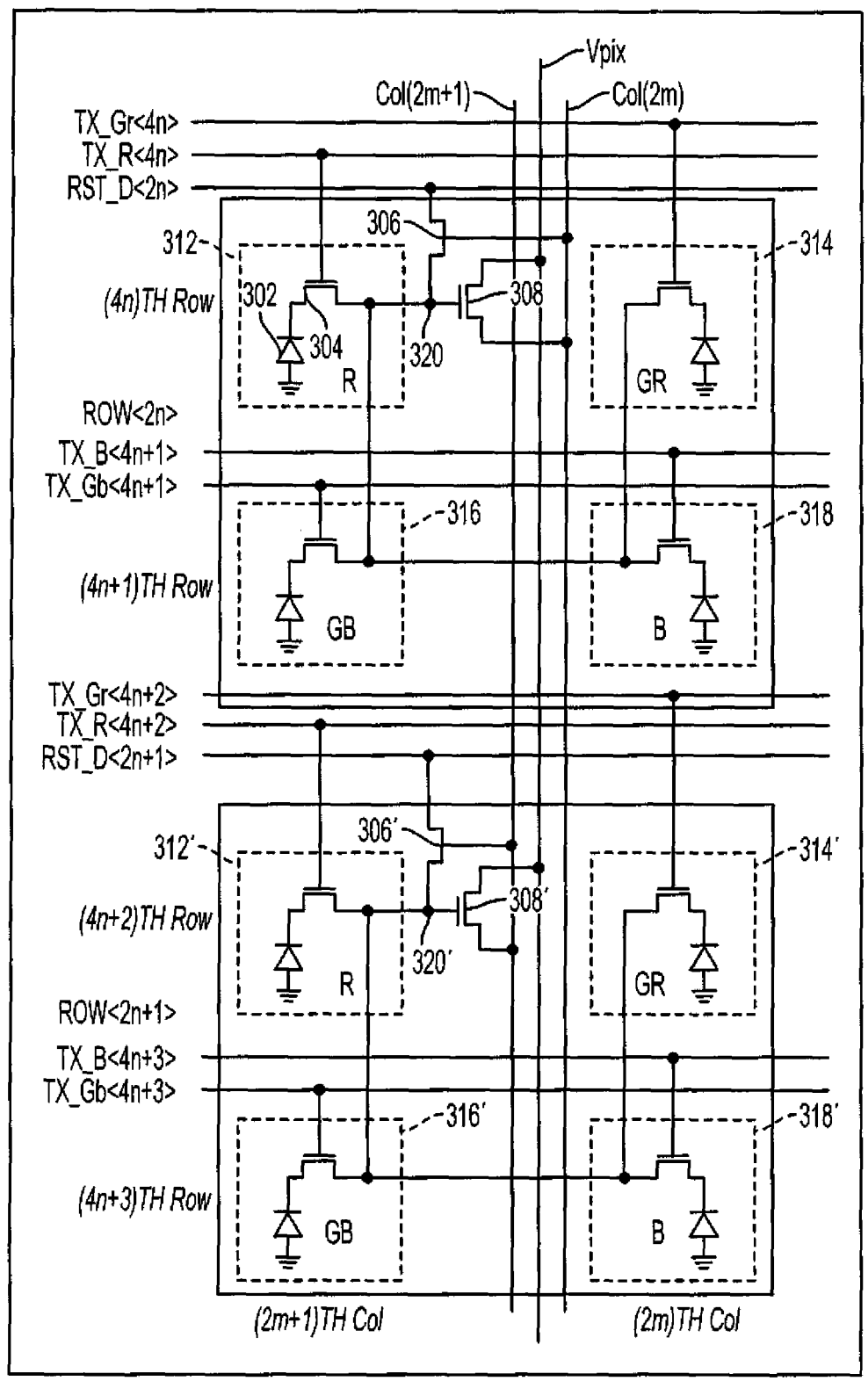
FIG. 8 is a view of another 4T CEPA without a row select transistor, and with reset transistors controlled by column lines, according to an embodiment of the present invention.
Figure 9:
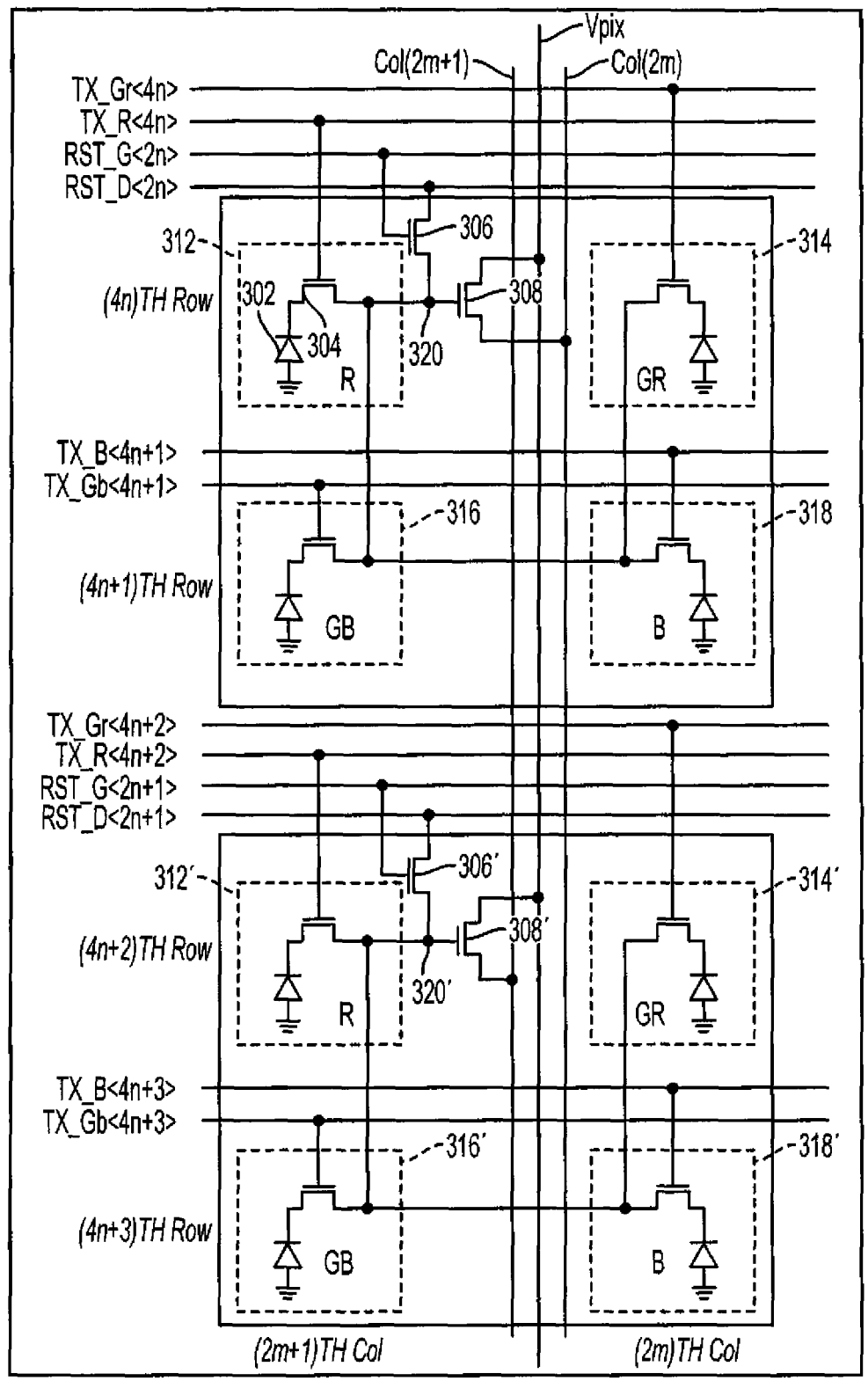
FIG. 9 is a view of another 4T CEPA without a row select transistor, and with reset transistors controlled by reset lines, according to an embodiment of the present invention.

In another embodiment shown in FIG. 8, the reset transistors 306 and 306' have their drains connected to different reset lines, and have their gate terminals connected to different column lines. In this configuration, the column lines and the reset lines are kept high for resetting floating diffusions 320 and 320' and then are released to perform SHR, charge transfer and SHS. The source follower transistors 308 and 308' are then turned off by pulling the column lines to high potentials and keeping the reset lines at low potentials. This allows the reset lines and column lines to control the output of charge onto the column lines without the need of a row select transistor.

In yet another embodiment, reset transistors 306 and 306' may have their gate terminals connected to separate reset lines RST_G<2n> and RST_G<2n+1>, and may also have their drain terminals connected to different reset lines RST_D<2n> and RST_D<2n+1>. The reset lines are kept at a high potential in order to reset floating diffusions 320 and 320', and to perform the SHR, charge transfer and SHS. The source follower transistors 308 and 308' may then be turned off by keeping the gate terminals at a high potential and the drain terminals at a low potential based on the reset line signals. This allows various reset lines to control the output of charge onto the column lines.

Figure 10:
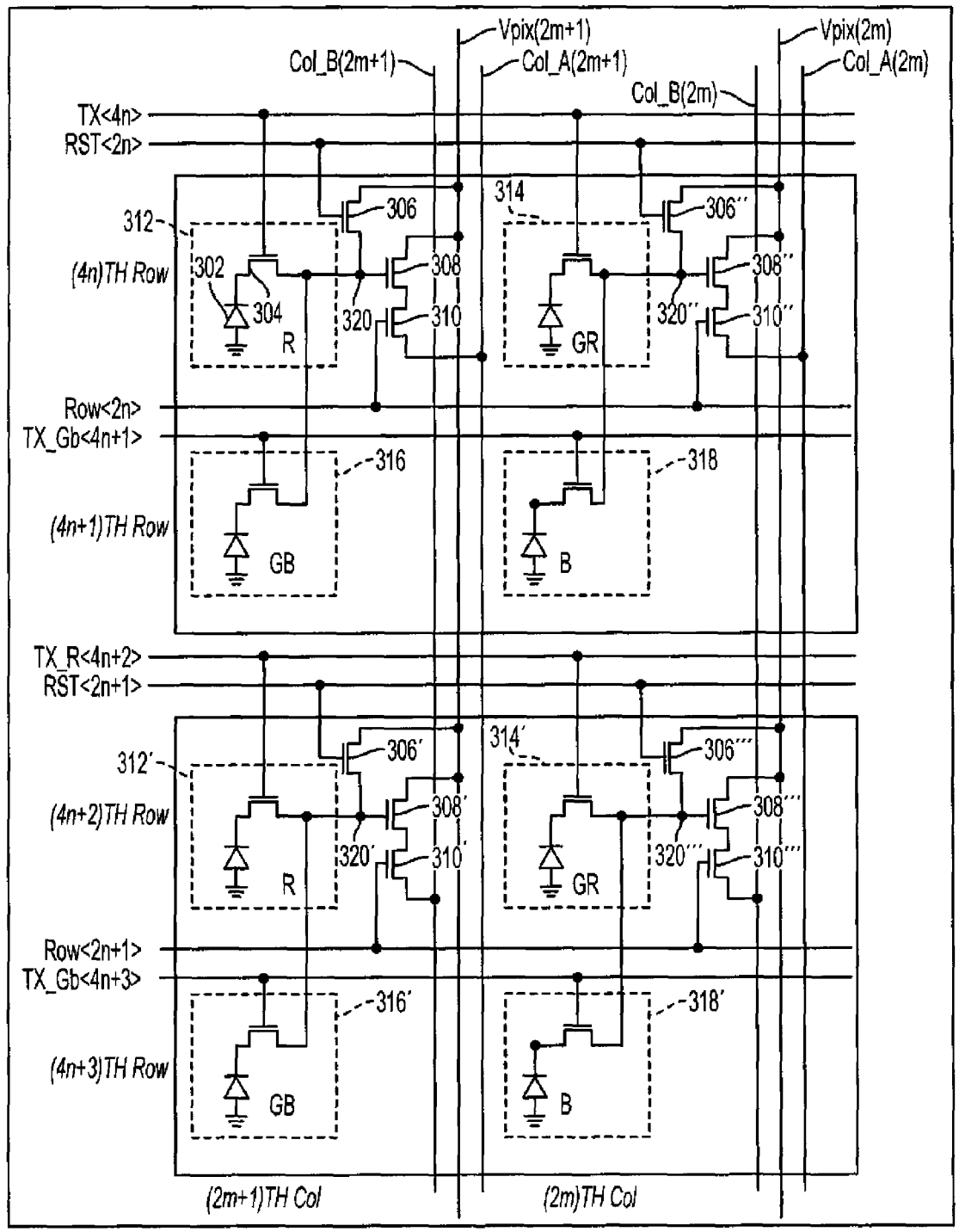
FIG. 10 is a view of another 4T CEPA with a second pair of column lines, according to an embodiment of the present invention.

Although FIGS. 3-9 show embodiments where groups of pixels include groups of four, it is shown in at least FIG. 10 that other configurations where different size groups may be configured. For example, as shown in FIG. 10, a group of two pixels in a column may share common circuitry and two column lines. Pixels 312 and 316 may be set as a first group of pixels which share common elements 306, 308, 310 and 320, and are connected to column line Col_A(2m+1). Another group on the same column may include pixels 312' and 316' which share common elements 306', 320', 308' and 310', and are connected to a different column line Col_B(2m+1). This configuration is repeated throughout pixel array 230 (i.e. pixels 314 and 318 share common elements 306", 320", 308"

and 310", whereas pixels 314' and 318' share common elements 306''', 320''', 308''' and 310''').

Thus, every two pixels in a particular column may be alternately connected to two different column lines (i.e. Col_A(2m+1) and Col_B(2m_1)). In this particular configuration, since every two pixels are sharing a column line, the readout speed may be increased as compared to FIG. 3. In a first readout period, red pixels 312 and 312' may be readout the same time as blue pixels 318 and 318' because they are coupled to separate column lines. In another readout period, green pixels 316 and 316' may be readout simultaneously as green pixels 314 and 314' because they are connected to different column lines. Thus, all four pixels in any particular group may be readout twice as fast as the embodiment shown in FIG. 3 because there are twice as many column lines.

It is noted that controllers and processors described with respect to the imager may be software based processors, application specific integrated circuits, or any other known equivalents for controlling the various elements (e.g. pixels, readout circuitry, etc.), and for processing the image. It is also noted that the imager may include memory such as RAM, ROM, or any other known equivalent for storing values (e.g. pixel values, images, software, etc.).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A common element pixel architecture (CEPA) imager comprising:
   a first column of pixels;
   a second column of pixels;
   a first column line;
   a second column line;
   a first group of pixels including pixels from the first column and the second column coupled to the first column line;
   a second group of pixels including other pixels from the first column and the second column coupled to the second column line;
   a color filter array having a color pattern arranged on both the first group of pixels and the second group of pixels;
   a controller configured to simultaneously output pixel values from pixels of a first color in the first column and in the first group over the first column line and from pixels of the first color in the first column and in the second group over the second column line;
   a first readout circuit coupling the pixels in the first group of pixels to the first column line; and
   a second readout circuit coupling the pixels in the second group of pixels to the second column line, wherein the first readout circuit and the second readout circuit respectively include a source follower transistor including a drain terminal coupled to a reference voltage line and a reset transistor including a drain terminal coupled to the reference voltage line.

2. The CEPA imager of claim 1, including a third column line coupled to a third group of pixels including pixels from the first column and the second column.

3. The CEPA imager of claim 2, including a controller configured to control the first group of pixels, the second group of pixels and the third group of pixels to simultaneously output pixel values on the first column line, the second column line and the third column line.

4. A common element pixel architecture (CEPA) imager comprising:

a first column of pixels and a second column of pixels, each of the pixels including a photodiode and a transfer transistor, wherein the transfer transistor of each pixel in the first column of pixels is controlled by a respective transfer line and wherein each transfer line is coupled exclusively to pixels in a common row;
a first column line;
a second column line;
a first group of pixels including pixels from the first column and the second column;
a second group of pixels including other pixels from the first column and the second column;
a first readout circuit coupling each of the transfer transistors in the first group of pixels to the first column line; and
a second readout circuit coupling each of the transfer transistors in the second group of pixels to the second column line, wherein the first readout circuit and the second readout circuit respectively include a source follower transistor including a drain terminal coupled to a reference voltage line and a reset transistor including a drain terminal coupled to the reference voltage line.

5. The CEPA imager of claim 4, wherein the first readout circuit and the second readout circuit respectively include:
   a plurality of respective transfer transistors coupling the photodiode of each respective pixel to a floating diffusion,
   a row select transistor outputting a voltage to the respective column lines based on electric charge in the floating diffusion, and wherein the CEPA imager includes:
      a controller configured to control the transfer transistors to transfer electric charge from the respective photodiodes to the floating diffusion, and to control the respective row select transistors to simultaneously output the respective voltages to the respective column lines based on the respective transferred electric charge.

6. The CEPA imager of claim 5, wherein the reset transistor includes a gate terminal coupled to a reset line and a source terminal coupled to the floating diffusion.

7. The CEPA imager of claim 5, wherein the reset transistor includes a gate terminal coupled to a respective column line and a source terminal coupled to the floating diffusion.

8. The CEPA imager of claim 4, wherein the first readout circuit and the second readout circuit respectively include a plurality of respective transfer transistors coupling the photodiode of each respective pixel to a floating diffusion, wherein the source follower transistor outputs a voltage to the respective column lines based on electric charge in the floating diffusion, and wherein the CEPA imager includes:
   a controller configured to control the respective transfer transistors to transfer electric charge from the respective photodiodes to the floating diffusion allowing the respective source follower transistors to output the respective voltages to the respective column lines based on the respective transferred electric charge.

9. The CEPA imager of claim 8, wherein the reset transistor includes a gate terminal coupled to a reset line and a source terminal coupled to the floating diffusion.

10. The CEPA imager of claim 1, wherein the color pattern is a Bayer color pattern.

11. The CEPA imager of claim 1, wherein each pixel in the first column of pixels comprises an associated transfer transistor, wherein each transfer transistor is controlled by a respective transfer line, and wherein each transfer line is coupled exclusively to pixels in a common row.

* * * * *